United States Patent [19]

Repplinger et al.

[11] Patent Number: 5,276,588
[45] Date of Patent: Jan. 4, 1994

[54] TELEPHONE HANDSET ASSEMBLY HAVING RIGID FASTENER FOR CONNECTING HANDSET ASSEMBLY PORTION-PORTIONS THERETOGETHER

[75] Inventors: Daniel J. Repplinger, Lake Zurich; Polly Jungels-Butler, Gilberts, both of Ill.

[73] Assignee: Motorola, Inc., Schaumburg, Ill.

[21] Appl. No.: 906,723

[22] Filed: Jun. 30, 1992

[51] Int. Cl.$^5$ .......................... H05K 5/00; H04B 1/08
[52] U.S. Cl. .................... 361/736; 292/300; 403/375; 455/347; 361/814
[58] Field of Search .............. 292/300; 455/347, 348, 455/349; 220/402, 306; 403/315, 316, 375, 376, 381; 174/50, 52.1; 361/380, 392, 395, 399, 422

[56] References Cited

U.S. PATENT DOCUMENTS

| | | | |
|---|---|---|---|
| 4,293,079 | 10/1981 | Lytle | 220/306 |
| 4,704,740 | 11/1987 | McKee et al. | 455/348 |
| 4,791,526 | 12/1988 | Breu et al. | 361/399 X |
| 4,972,508 | 11/1990 | King | 455/347 X |
| 5,100,214 | 3/1992 | Kitaue | 312/223.2 |
| 5,140,108 | 8/1992 | Miyajima | 174/52.1 |

Primary Examiner—Leo P. Picard
Assistant Examiner—Michael W. Phillips
Attorney, Agent, or Firm—Robert H. Kelly

[57] ABSTRACT

A fastener for a housing assembly. The fastener is comprised of a key having a hooked end portion formed to project beneath a front housing assembly portion, and a track member formed in a side wall of a rear housing assembly portion. Top and bottom face surfaces of the hooked projecting portion of the key, and top and bottom ledge surfaces of the track member are semi-circular in configuration. Interfitting surfaces of the front and rear housing assembly portions are also semi-circular in configuration. When the front and rear housing assembly portions are tandemly-positioned, and aligned with one another, the hooked end portion of the key and the track member engage with one another. Radial translation of the front housing assembly portion repositions the key projecting therebeneath at a fastening side of the track number to fasten thereby the front and rear housing assembly portions theretogether.

14 Claims, 5 Drawing Sheets

TELEPHONE HANDSET ASSEMBLY HAVING RIGID FASTENER FOR CONNECTING HANDSET ASSEMBLY PORTION-PORTIONS THERETOGETHER

BACKGROUND OF THE INVENTION

The present invention relates generally to fasteners for fastening two surfaces theretogether, and, more particularly, to a fastener for fastening a housing assembly theretogether.

Many electronic devices are comprised of electronic circuitry disposed upon one or more electrical circuit boards which are housed within a housing assembly. The housing assembly provides a supportive enclosure for supporting the electrical circuit boards therewithin and facilitates handling, and usage of the electronic device by a user.

Typically, the housing assembly is comprised of two portions. A first portion of the housing assembly is commonly referred to as a front (or top) housing assembly portion. And, a second portion of the housing assembly is commonly referred to as a rear (or bottom) housing assembly portion. The one or more circuit boards upon which the electronic circuitry of the electronic device is disposed is suitably positioned, or otherwise affixed, to one of the housing assembly portions. Thereafter, the other of the housing assembly portions is positioned in tandem with the first of the housing assembly portions so as to enclose the one or more circuit boards within the housing assembly in supportive enclosure therein.

Once the two housing assembly portions have been tandemly-positioned to enclose the one or more circuit boards in supportive enclosure therewithin, the housing assembly portions are typically fastened theretogether to maintain the housing assembly portions in tandem to maintain the one or more electrical circuit boards in the supportive enclosure.

Most simply, the housing assembly portions may be fastened theretogether by threaded shaft members engaging with the opposing housing assembly portions. Fasteners may also be integrally formed within the housing assembly portions such that, once the housing assembly portions are properly aligned to be tandemly-positioned, the housing assembly portions become fastened to one another by their mere proximity to one another.

Usually, when the fastener is integrally formed within the housing assembly portions, the fastener is formed of mated portions formed upon each of the housing assembly portions. Once the housing assembly portions are suitably aligned with one another to be tandemly-positioned thereby, mated engagement between the portions of the fastener result in the fastening of the housing assembly portions theretogether.

Use of such fasteners which are integrally formed with the housing assembly portions is particularly advantageous when the housing assembly portions are formed of a thermoplastic material as the fastener may be formed along with the housing assembly portions during molding of the housing assembly portions.

In some existing designs of fasteners comprised of the thermoplastic material and formed integral with the housing assembly portions, the fastener is constructed such that one portion thereof is flexible. When the housing assembly portions are positioned theretogether, the flexible, fastener portion of the fastener bends, or elastically deforms. Such fasteners are constructed such that the bending or elastic deformation of the fastener portion permits positioning of the fastener portions at a fastening position, thereby to fasten the housing assembly portions theretogether.

A flexing-member, snap-hook fastener is an example of such a fastener. In such a fastener, a rigid hook member is formed to protrude beyond a surface of one of the housing assembly portions. A flexible hook-retaining ring is formed upon the other of the other of the housing assembly portions. When the housing assembly portions are aligned with one another, the hook member protruding beyond a surface of one of the housing assembly portions engages with the flexible, hook-retaining ring.

Over time, the ability of such a flexing-member, snap-hook fastener to fasten adequately the housing assembly portions theretogether may be reduced due to loss of structural integrity of the flexible, hook-retaining ring of such a fastener. Loss of structural integrity of the flexible, hook-retaining ring may also occur after repeated use of such a fastener to fasten, and then to release, repeatedly, the housing assembly portions from their fastening engagement. Additionally, constructions of such a fastener requires specially-designed tools to release the fastener portions of the fastener from their fastening engagement to permit thereafter removal of the housing assembly portions from their tandem positions.

A radio transceiver, such as a radio telephone utilized in a cellular, communication system, is an example of an electronic device which typically is formed of one or more circuit boards supportively enclosed within a housing assembly. Radio telephone constructions operative in such a cellular, communication system are of many varied designs. One such design of a radio telephone is a mobile radio telephone which is constructed to permit mounting of the telephone within a vehicle. Another design of a radio telephone is a portable radio telephone.

Mobile radio telephones, constructed to be mounted permanently, or semi-permanently, in a vehicle need not be constructed to minimize the physical dimensions and weight thereof. Conversely, portable radio telephones, constructed to be carried by a user, are constructed to be of minimal physical dimensions and weight. In either type of radio telephone design, however, the radio telephone includes electronic circuitry disposed upon electrical circuit boards which are housed within a housing assembly, in manners described hereinabove.

Mobile radio telephones and portable radio telephones each include a handset having a speaker and a microphone supported therein. The handset typically further includes electrical circuitry disposed upon one or more circuit boards which, together with the speaker and the microphone, are housed within a housing assembly, similar to a housing assembly, as above-described.

In a portable radio telephone, the entire circuitry of the radio telephone is housed within the housing assembly of the handset. In a mobile radio telephone, typically, a portion of the circuitry of the radio telephone is housed within the housing assembly of the handset, and the handset is coupled to additional transceiver circuitry by way of a cable.

As the circuitry housed within the housing assembly of the radio telephone of either type of construction includes circuitry which generates high frequency signals as a byproduct of normal operation thereof (such signals are in addition to, and distinct from, the desired radio frequency signal transmitted upon a desired radio frequency channel by the radio telephone), the housing assembly must further function as a shield to prevent emanation of such high frequency signals. Accordingly, the housing assembly portions of the housing assembly, when fastened theretogether by one or more fasteners, must seat against one another in a manner to prevent emanation of the high frequency signals thereaway. Fastening of the housing assembly portions theretogether by the fasteners in such a manner is also advantageous for acoustic and aesthetic reasons.

Commercial assembly of such handsets is typically carried out in an assembly line-like manner. Fasteners utilized to fasten the front and rear housing assembly portions of the handset housing assemblies of such handsets of either design of radio telephone must permit quick assembly and fastening of the housing assembly portions theretogether by assembly line personnel.

Such design of fastener should permit the fastening theretogether of the housing assembly portions while not requiring manufacture of the handset housing portions to be within stringent manufacturing tolerances. Such design of fastener should also not be susceptible to loss of structural integrity.

What is needed, therefore, is a fastener for fastening portions of a housing assembly theretogether which does not require great precision of the fastener components and which is not susceptible to loss of structural integrity.

SUMMARY OF THE INVENTION

The present invention, accordingly, advantageously provides a fastener for fastening portions of a housing assembly theretogether.

The present invention further advantageously provides a housing assembly for housing a circuit board in supportive enclosure therewithin.

The present invention includes further advantages and features, the details of which will become more apparent by reading the following detailed description of the preferred embodiments hereinbelow.

In accordance with the present invention, therefore, a fastener is disclosed for fastening a front housing portion and a tandemly-positioned rear housing portion of a housing assembly theretogether. The rear housing portion has a perimetal flange extending about at least a portion of a perimeter of the rear housing portion wherein the perimetal flange has a top edge surface for receiving the front housing portion in abutting engagement thereupon. At least one key has a hooked end portion coupled to, and extending beneath, the front housing portion wherein the hooked end portion of the at least one key has a top face surface, a bottom face surface, and side face surfaces. At least one track member, having a receiving side and a fastening side, is formed upon an inner sidewall of the perimetal flange of the rear housing portion. The at least one track member receives the hooked end portion of the at least one key at the receiving side of the track member when the front housing portion and the rear housing portion are tandemly-positioned, and the at least one key is aligned with the receiving side of the at least one track member. Once the hooked end portion is positioned at the receiving side, sliding translation of the front housing portion upon the top edge surface of the perimetal flange of the rear housing portion causes translation of the hooked end portion of the key along the track member to position the hooked end portion at the fastening side to fasten the front housing portion and the rear housing portion theretogether when positioned thereat.

BRIEF DESCRIPTION OF THE DRAWINGS

The present invention will be better understood when read in light of the accompanying drawings in which.

DESCRIPTION OF THE PREFERRED EMBODIMENTS

Figure 1:
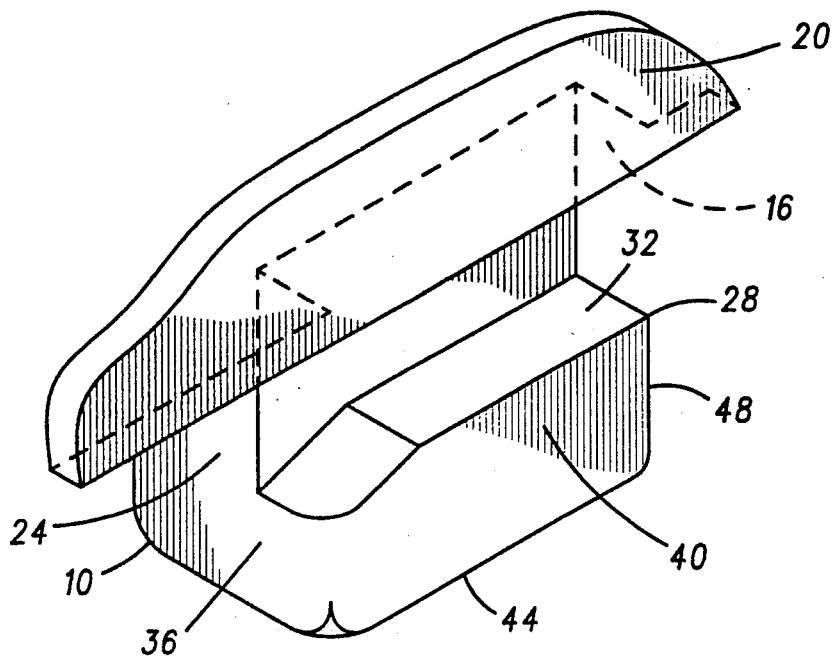
FIG. 1, is a cutaway, perspective view of a key forming a portion of the fastener of the preferred embodiment of the present invention.

Referring first to the cutaway, perspective view of FIG. 1, a key, referred to generally by reference numeral 10, which forms a portion of the fastener of the preferred embodiment of the present invention is shown. Key 10 is affixed to, and projects beneath, surface 16. Surface 16 here is a bottom surface of front housing assembly portion 20. Front housing assembly portion 20 is preferably comprised of a thermoplastic material shaped during a molding process, and key 10 is preferably integrally formed with housing assembly portion 20 during such molding process. Other materials of construction, and means for affixing discrete key 10 to surface 16 may, of course, alternately be utilized.

In the preferred embodiment illustrated in FIG. 1, key 10 is formed of a rigid, downwardly-projecting bar member 24 which has a hooked end portion 28. Hooked end portion 28 of bar member 24 defines top face surface 32, front face surface 36, and side face surface 40. While hidden from view in the orientation of FIG. 1, hooked end portion 28 of bar member 24 further defines a bottom face surface, denoted by reference numeral 44, and rear face surface, designated by reference numeral 48. Surfaces 32-48 form force receiving and force transmitting surfaces for receiving and transmitting forces exerted upon the various surfaces. For reasons to be discussed hereinbelow, bottom face surface 44 is semicircular in configuration, and top face surface 32 is substantially semi-circular in configuration but for a beveled, lead-in, front edge surface.

Figure 2:
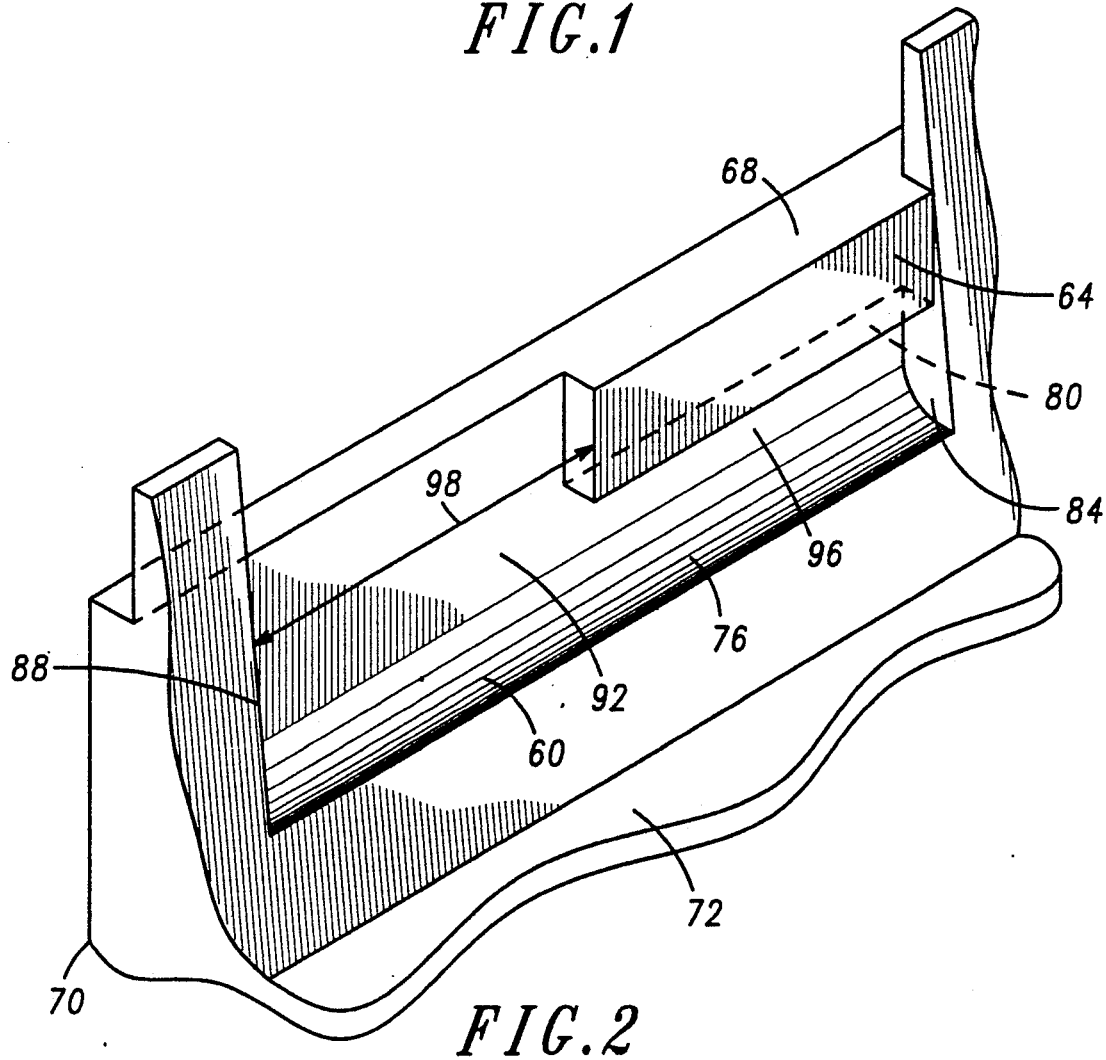
FIG. 2, is a cutaway, perspective view of a track member forming a portion of the fastener of the preferred embodiment of the present invention.

Turning next to the cutaway, perspective view of FIG. 2, a track member, referred to generally by reference numeral 60, which forms another portion of the fastener of the preferred embodiment of the present invention is shown. Track member 60 is formed to extend into surface 64. In the preferred embodiment illustrated, surface 64 is an inner surface of a side wall flange 68. Side wall flange 68 extends about a perimeter 70 of a face surface of rear housing assembly portion 72.

Track member 60 defines bottom ledge surface 76, a top ledge surface 80, and end wall surfaces 84 and 88. End wall surface 84 connects bottom ledge surface 76 with top ledge surface 80. Track member 60 further defines a receiving side, designated by reference numeral 92, and a fastening side, designated by reference numeral 96. Bottom ledge surface 76 extends the entire length between receiving side 92 and fastening side 96. Top ledge surface 80 extends along only fastening side 96 of track number 60. Because top ledge surface 80 extends along only fastening side 96 of track number 60, receiving side 92 of track member 60 extends to a top surface of side wall flange 68 to form thereat a gap, indicated by arrow 98 in the figure. For reasons to be discussed hereinbelow, bottom and top ledge surfaces 76 and 80 are semi-circular in configuration.

Figure 3:
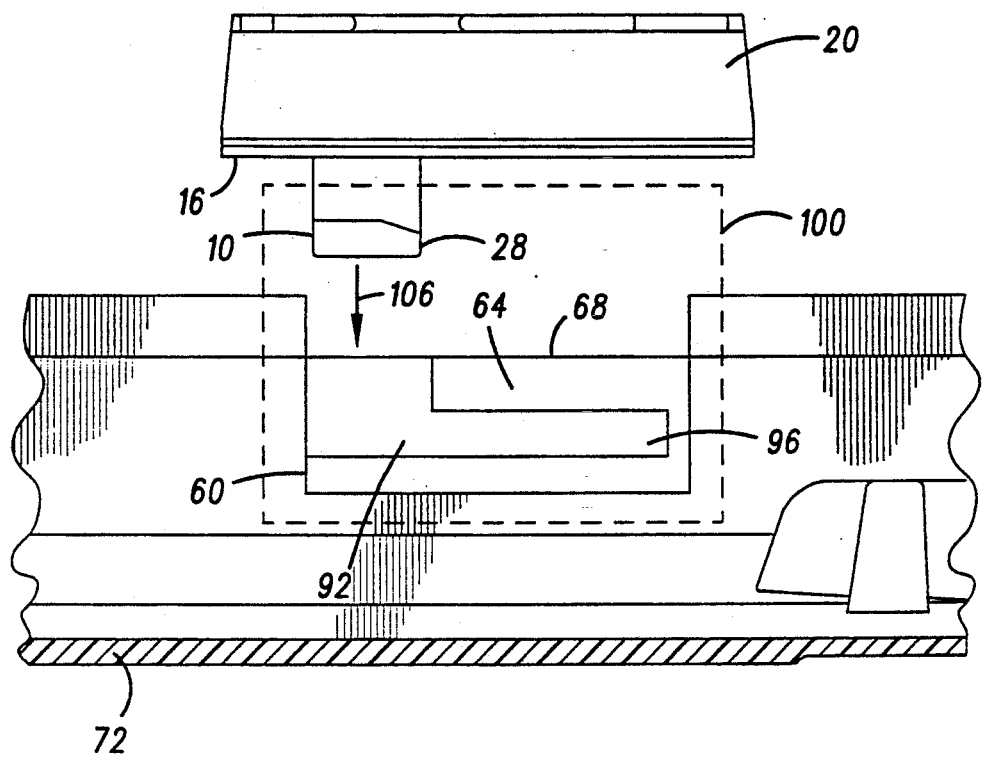
FIG. 3, is a side, elevational view illustrating the relationship between the key of FIG. 1 and the track member of FIG. 2 which together form a fastener of the preferred embodiment of the present invention.

Turning next to the side, elevational view of FIG. 3, front housing assembly portion 20 to which key 10 is integrally formed to project therebeneath is positioned in tandem with side wall flange 68 extending above a face surface of rear housing assembly portion 72. As previously shown with respect to the perspective view of FIG. 2, track member 60 is formed to extend into an inner side wall of side wall flange 68.

Key 10 and track member 60 together form the fastener, referred to generally by reference numeral 100, and indicated in the figure by the block shown in hatch, of the preferred embodiment of the present invention. Fastener 100 is operative to fasten top housing assembly portion 20 and rear housing assembly portion 72 theretogether.

Hooked end portion 28 of key 10 is of widthwise dimensions permitting insertion of the hooked end portion 28 into the gap (indicated by arrow 98 of FIG. 2) formed to extend into the top surface of side wall flange 68 of rear housing assembly portion 72. By translating the front housing assembly portion 20 in the direction indicated by arrow 106 in the figure, front and rear housing assembly portions 20 and 72 are positioned in abutting, face-to-face engagement with one another, and hooked end portion 28 of key 10 becomes positioned at receiving side 92 of track member 60.

Figure 4:
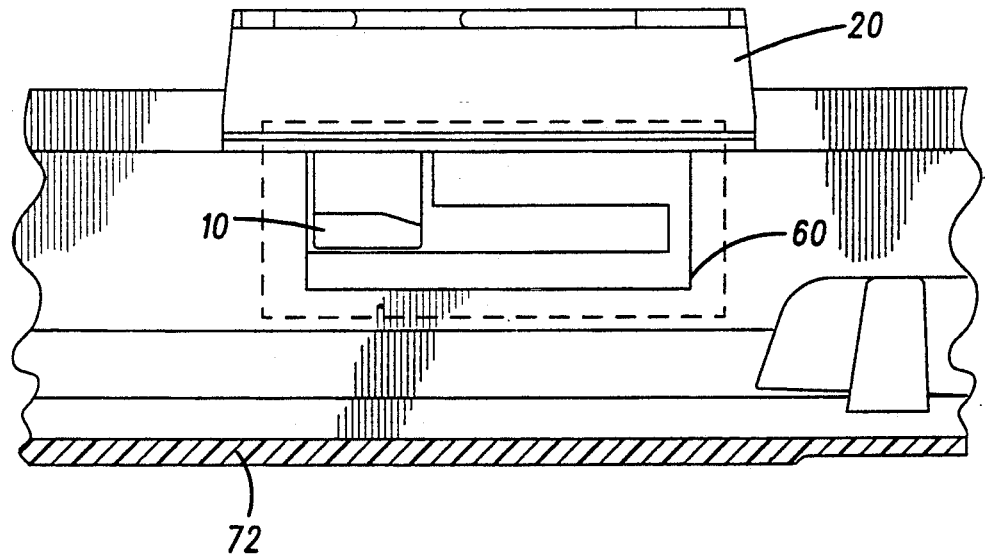
FIG. 4 is a side, elevational view, similar with that of FIG. 3, but illustrating the relationship between the key and track member of the fastener of the preferred embodiment of the present invention when the key is positioned at the receiving side of the track member.

Turning next to the side, elevational view of FIG. 4, front housing assembly portion 20 and rear housing assembly portion 72 are shown when positioned in the abutting, face-to-face engagement with one another. As illustrated, hooked end portion 28 of key 10 extends into the gap extending into the top surface of side wall flange 68. Key 10 is of a length such that, when bottom surface 16 of front housing assembly portion 20 rests upon the tops surface of side wall flange 68 of rear housing assembly portion 72, hooked end portion 28 is positioned at an elevation permitting translation of the key 10 out of the receiving side 92 of track member 60 and into fastening side 96 thereof (upon application of a sliding force thereto).

The height of side face surface 40 of hooked end portion 28 of key 10 is slightly less than the height of end wall surface 84 of track member 60. Sliding translation of hooked end portion 28 along track member 60 is thereby permitted. The beveled, lead-in, front portion of face surface 32 facilitates translation of the hooked end portion 28 of key 10 out of the receiving side of track member 60 into the fastening side thereof by permitting a smooth interface between surface 32 and top ledge surface 80. When hooked end portion 28 of key 10 is positioned at the fastening side, surfaces 32 and 80 are positioned in a face-to-face relationship along their entire lengths.

As the abutting surfaces of the front and rear housing assembly portions 20 and 72 (namely, bottom surface 16 of front housing assembly portion 20 and the top surface of sidewall flange 68 of rear housing assembly portion 72) are semi-circular in configuration (and define arcs of concentric circles), such translation results in relative, radial movement between such abutting surfaces.

By translating top housing assembly portion 20 to cause corresponding translation of key 10 formed integral therewith, hooked end portion 28 is translated out of receiving side 92 of track number 60 and into fastening side 96 of the track member. Once positioned at fastening side 96 of the track member, separation forces exerted upon one or both of the housing assembly portions 20 and 72 do not result in separation of the housing assembly portions. Rather, separation forces acting upon top housing assembly portion 20 or upon rear housing assembly portion 72 cause top face surface 32 of hooked end portion 28 of key 10 to abut against top ledge surface 80 of track member 60. Separation forces exerted upon one of the housing assembly portions 20 and 72 are transmitted to the other of the housing assembly portions by way of top face surface 32 and top ledge surface 80 of the respective portions of fastener 100.

Figure 5:
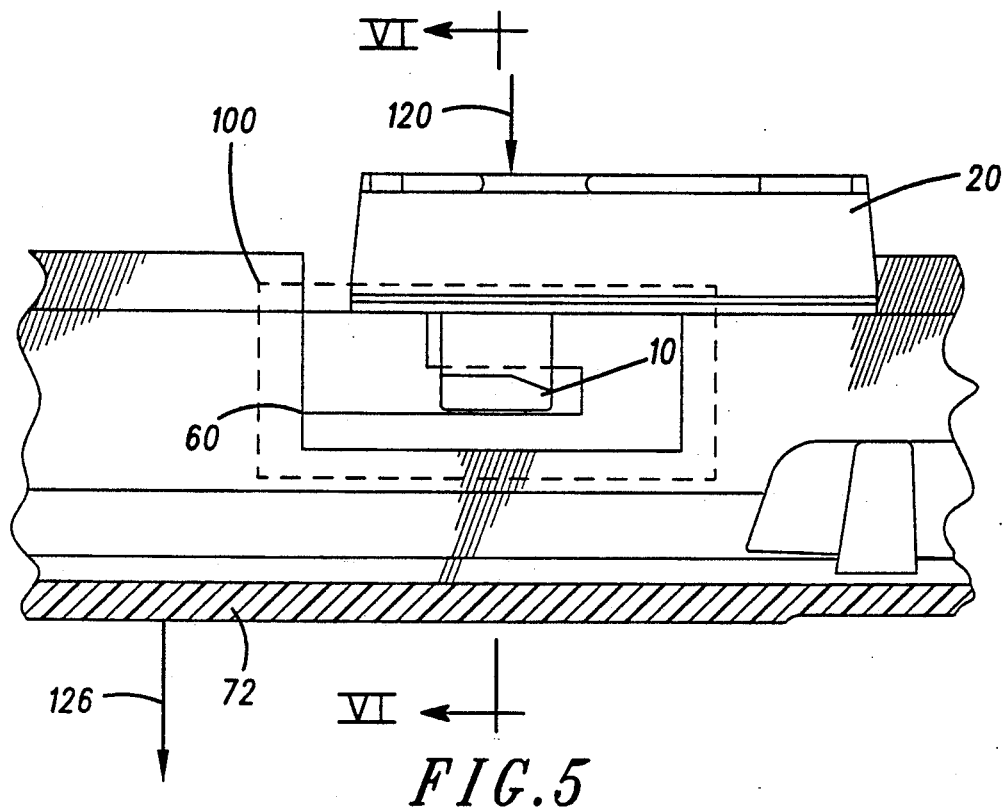
FIG. 5 is a side, elevational view similar with those of FIGS. 3 and 4, but illustrating the relationship between the key and track member of the fastener of the preferred embodiment of the present invention when the key is positioned at the fastening side of the track member.

Turning next to the side, elevational view of FIG. 5, the relation between front housing assembly portion 20 and rear housing assembly portion 72 after the top housing assembly portion 20 has been translated to position hooked end portion 28 of key 10 at fastening side 96 of track number 60. Separation forces exerted upon front housing assembly portion 20 in directions indicated by arrow 120 or upon rear housing assembly portion 72 in directions indicated by arrow 126 do not cause separation of the two housing assembly portions 20 and 72. Rather, separation forces exerted upon one or the other of the housing assembly portions are transmitted to the other by way of the abutting engagement between top face surface 32 of hooked end portion 28 of key 10 and top ledge surface 80 of track number 60. (It is further noted that compressive forces exerted upon one or the other housing assembly portions 20 and 72 are transmitted to the other of the portions by way of the face-to-face contact between surface 16 and a top surface of flange 68.)

In such manner, the two housing assembly portions 20 and 72 are fastened theretogether by merely tandemly-positioning the two housing assembly portions in an aligned relation, inserting the key 10 into the gap (indicated in FIG. 2 by arrow 98) formed upon the top surface of side wall flange 68 until surface 16 abuts against the top surface of flange 68, and translating the front housing assembly portion 20 to position the hooked end portion 28 at fastening side 96 of the track member 60.

Figure 6:
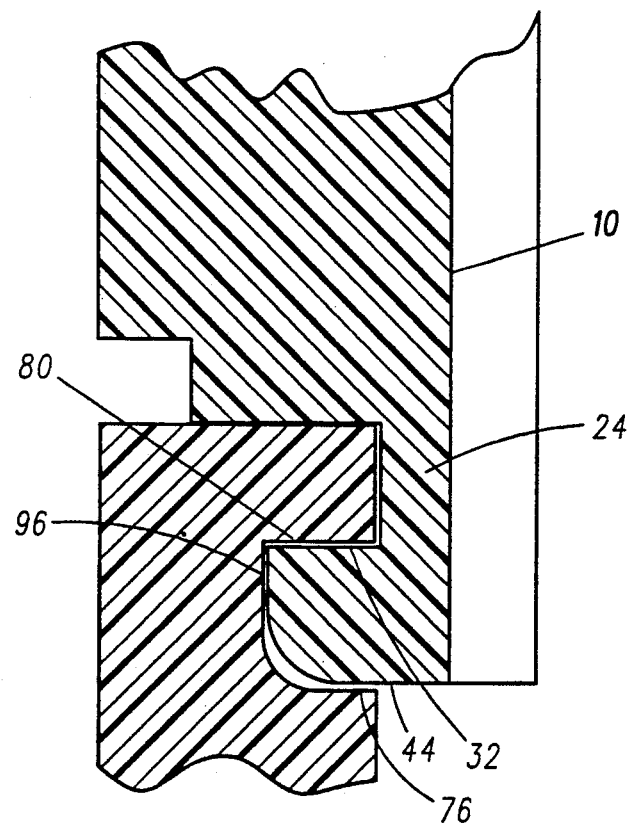
FIG. 6, is a cross-sectional view taken along lines VI—VI of FIG. 5.

Turning next to the cross-sectional view of FIG. 6, a sectional view taken along lines VI—VI of FIG. 5 is shown. The sectional view of FIG. 6 illustrates the relationship between hooked end portion 28 of key 10 and track member 60 when the hooked end portion of key 10 is positioned at fastening side 96 of the track member. When positioned at fastening side 96, top face surface 32 of hooked end portion 28 is positioned against top ledge surface 80 of track member 60. Application of separation forces to either of the housing assembly portions 20 or 72 are transmitted to the other of the housing assembly portions, thereby to prevent separation of the housing assembly portions thereapart.

Figure 7:
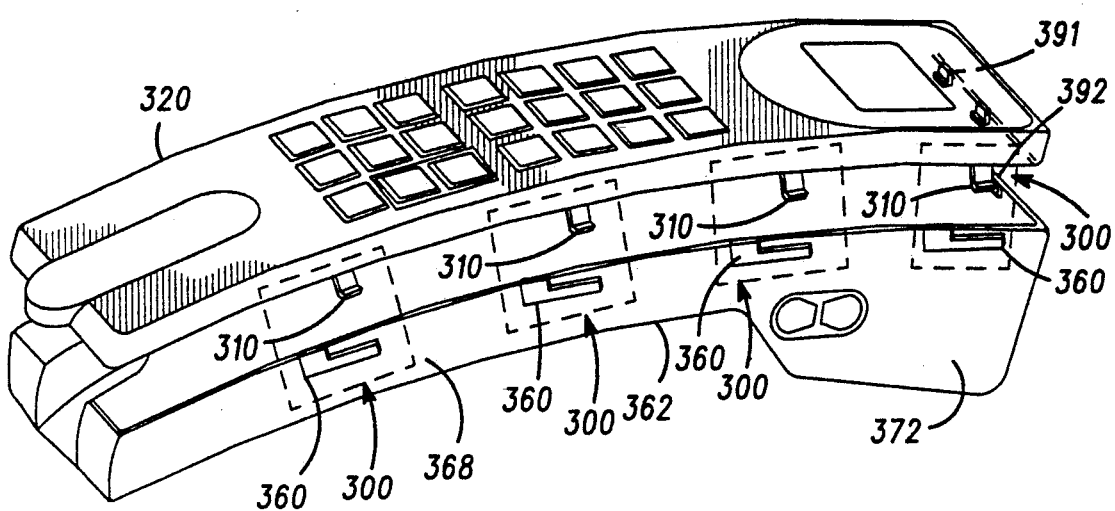
FIG. 7, is a somewhat exploded, perspective view of a housing assembly of a preferred embodiment of the present invention in which a plurality of fasteners similar to the fastener of the preceding figures forms a portion thereof.

Turning now to the exploded, perspective view of FIG. 7, a housing assembly, referred to generally by reference numeral 290 is shown. Housing assembly 290 comprises a plurality of fasteners, here designated by reference numerals 300 indicated by the blocks shown in hatch. Each fastener 300, corresponds to fastener 100 of the preceding figures and is comprised of a key 310 formed to extend beneath front housing assembly portion 320 and a track member 360, illustrated in hatch, formed in sidewall flange 368 of rear housing assembly portion 372. While fasteners 300 are only shown in the figure on one side of housing assembly 290, it is to be understood, of course, that, in the preferred embodiment, other fasteners 300 are similarly formed on the side of housing assembly 290 hidden from view in the figure. The plurality of keys 310 formed to project beneath front housing assembly portion 320 are positioned at spaced-apart locations along the length of front housing assembly portion 320, and track numbers 360 are similarly formed at spaced-apart locations along the length of side wall flange 368 of rear housing assembly portion 372 to permit alignment of respective ones of the fasteners 310 and track numbers 360 of fasteners 300.

Once the front and rear housing assembly portions 320 and 372 are tandemly-positioned, and properly aligned, to permit mated engagement between respective ones of the keys 310 and track members 360 of fasteners 300, front housing assembly portion 320 may be lowered into position upon the top surface of side wall flange 368 to position the hooked end portions of each of the keys 310 at receiving sides of respective ones of the track members 360.

While, for reasons of simplicity, the receiving and fastening sides of track members 360 are not separately numbered in FIG. 7, track members 360, and the receiving and fastening sides formed thereof, are similar in all manners to track member 60 and receiving and fastening sides 92 and 96 thereof shown in the preceding figures.

Once the hooked end portions of keys of 310 are positioned at the receiving sides of corresponding ones of the track members 360, application of a translation force upon front housing assembly portion 320 permits relative, radial movement between the housing assembly portions (and the hooked portions of the keys and the track members) to position thereafter the keys 310 at fastening sides of the respective ones of the track members 360.

In one preferred embodiment of the present invention, continued translation of front housing assembly portion 320 is prevented once side face surfaces of the keys 30 (analogous to side face surfaces 36 or 48 of key 10 of FIG. 2) abut against end wall surfaces (corresponding to end wall surface 84 of track number 60 of FIG. 2) of the track members 360.

In the preferred embodiment illustrated in FIG. 7, however, downwardly-projecting bars 391 are formed to project beneath a bottom surface of front housing assembly portion 320 at an end of the front housing assembly portion. Translation of housing assembly portion 320 causes face surfaces of bars 391 to abut against end wall flange 392 of rear housing assembly portion 372. Use of downwardly-projecting bars 391 is advantageous in that the need for stringent, manufacturing tolerances of the formation of the housing assembly 290 are reduced as the face surfaces of bars 391 form the force transmitting surfaces which prevent continued translation of housing assembly portion 320 rather than face surfaces of the plurality of hooked end portions of the plurality of keys 310.

Once the keys 310 have been positioned at fastening sides of track numbers 360, separation forces applied to housing assembly portions 320 and 372 do not result in separation of the housing assembly portions thereapart; rather, separation forces applied to one of the housing assembly portions 320 or 372 are transmitted to the other of the housing assembly portions.

The semi-circular nature of the bottom surface of front housing assembly portion 320, and the top surfaces of side wall flange 368 of rear housing assembly portion 372, briefly noted hereinabove, is best seen in the perspective view of FIG. 7. As also noted previously hereinabove, bottom face surfaces of the keys, here keys 310, are similarly semi-circular in nature, as are bottom and top ledge surfaces (corresponding to surfaces 76 and 80 of track number 60 of FIG. 2) of track members 360. While the top face surface of hooked projecting portions of keys 310 are substantially semi-circular in nature, these top face surfaces include beveled lead-ins to facilitate sliding translation of the hooked projecting portions of the keys along the track members as the keys are translated out of the receiving sides of the track members and into the fastening sides thereof.

Figure 8:
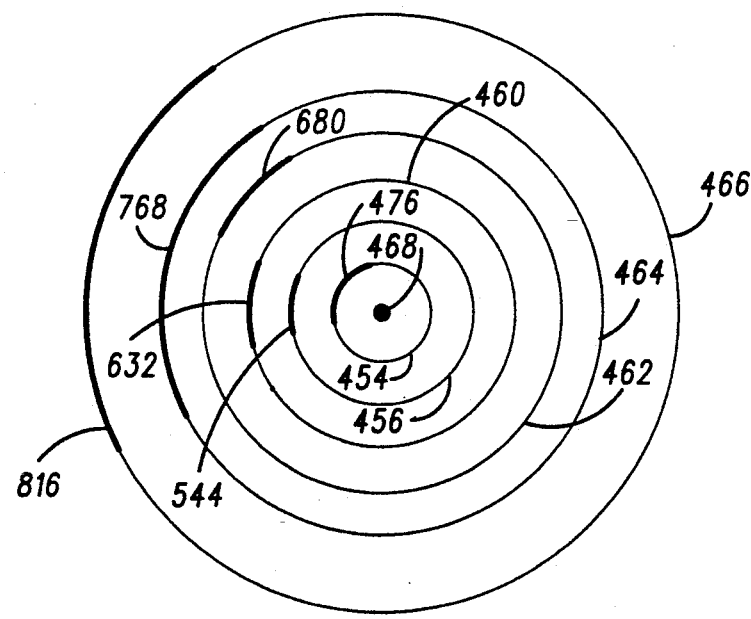
FIG. 8, is a geometric representation of various portions of the housing assembly of FIG. 7.

Turning next to the geometric representation, referred to generally by reference numeral 450 of FIG. 8, the relationship between various surfaces of the fastener and housing assembly portions of the present invention are shown. As mentioned briefly with respect to various of the preceding figures, surfaces of the hooked end portion of the keys 10 and 310, the bottom and top ledges, such as bottom and top ledge surfaces 76 and 80 shown in FIG. 2 of track member 360 (as well as corresponding ledge surfaces of track member 360 of FIG. 7) and surface portions of the front and rear housing assembly portions 20 and 72, and 320 and 372, which interface with each other, are semi-circular in nature. While the geometric representation 450 of FIG. 8 is greatly exaggerated for purposes of illustration, segmental portions of concentric circles 454, 456, 460, 462, 464, and 466 centered about center point 468 correspond to various surfaces of the fastener and housing assembly of the preferred embodiments of the present invention.

Namely, segmental portion 476 corresponds with a bottom ledge surface, such as bottom ledge surface 76 of track member 60. Segmental portions 544 and 632 correspond to bottom and top face surfaces of the hooked projecting portions, such as bottom and top face surfaces 44 and 32 of hooked projecting portions 28 of key 10 of key 10 (as well as corresponding surfaces of a hooked projecting portion of key 310). Segmental portion 680 corresponds to the configuration of top ledge surfaces (such as top ledge surface 80 of FIG. 2) of the track members 60 and 360. Segmental portion 768 corresponds to the configuration of the top surface of the side wall flange of the rear housing assembly portion, such as the top surfaces of side wall flanges 68 of rear housing assembly portion 72 of FIG. 2 (as well as corresponding surfaces of rear housing assembly portion 372 of FIG. 7). And, segmental portion 816 corresponds to the configuration of a bottom surface of a front housing assembly portion, such as bottom surface 16 of front housing assembly portion 20 of FIG. 1 or a bottom surface of front housing assembly portion 320 of FIG. 7.

Because the respective surface portions of the fasteners 100 and 300 of the preceding figures are of geometric configurations of concentric circles, positioning of the respective surfaces in the abutting engagements therebetween permits interfacing engagements between such abutting surfaces. Application of the translation forces to the front housing assembly portions permits radial movement between respective ones of the surfaces to permit translation of the keys 10 and 310 between the receiving sides and fastening sides of track members 60 and 360. And, because such surfaces are semi-circular in configuration, construction of the housing assembly to be similarly of a semi-circular configuration is facilitated. As the housing assembly of a preferred embodiment of the present invention forms a handset for a radio telephone, the ergonometric appearance and handling of such a handset is increased.

Figure 9:
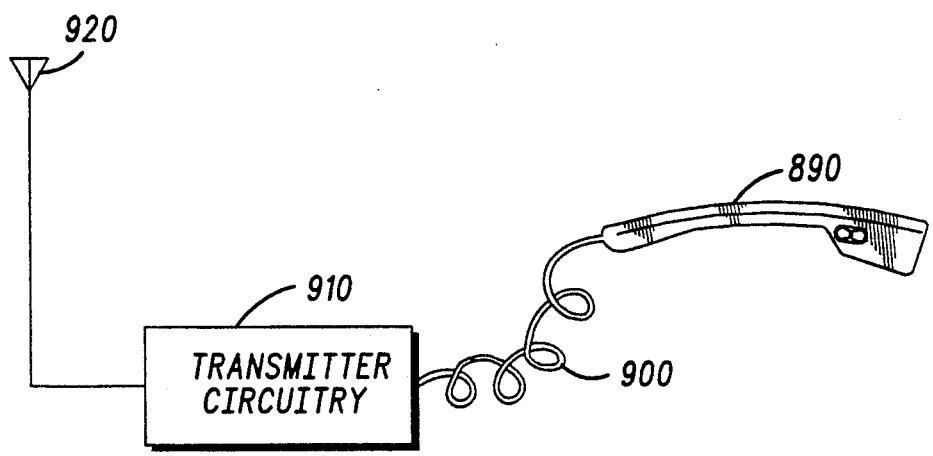
FIG. 9, is an isometric view of a radio transceiver of a preferred embodiment of the present invention which incorporates the fastener of the preceding figures as a portion thereof.

Turning finally now to the partial block, partial perspective view of FIG. 9, a radio telephone, referred to generally by reference numeral 880, of a preferred embodiment of the present invention is shown. Transceiver 880 includes handset 890 formed in the configuration of housing assembly 290 of FIG. 7. Handset 890 includes electronic circuitry disposed upon one or more circuit boards housed in supportive enclosure therewithin. Cable 900, coupled to the electronic circuitry housed within handset 890 is also coupled to transceiver circuitry 910. Transceiver circuitry 910 is, in turn, coupled to antenna 920. Transceiver 880 is operative in conventional fashion to transmit and to receive radio frequency communication signals.

Use of the fasteners of the preferred embodiment of the present invention in a radio telephone handset housing assembly is also advantageous as such fasteners facilitate seating of opposing surfaces of the housing assembly portions against one another thereby to facilitate a tight seal between the two housing assembly portions. Such tight seal limits undesired radio frequency emanations and is also advantageous for acoustic and aesthetic reasons.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. In a telephonic handset housing assembly having a front housing portion and a tandemly-positioned rear housing portion, the rear housing portion having a perimetal flange extending about at least a portion of a perimeter thereabout, and the perimetal flange having a top edge surface for receiving the front housing portion in abutting engagement thereupon, a combination with the front housing portion and the rear housing portion of a fastener for fastening the front and rear housing portions, respectively, theretogether, said fastener comprising:

at least one key having a hooked end portion coupled to, and extending beneath, the front housing portion, the hooked end portion of the at least one key having a top face surface, a bottom face surface, and side face surfaces wherein the hooked end portion is semi-circular in configuration with the top face surface of the hooked end portion defined by a circle of a first radial length and the bottom surface of the front housing portion is of a semi-circular configuration defined by a circle of a second radial length which is concentric with the circle of the first radial length; and at least one track member, formed upon an inner sidewall of the perimetal flange of the rear housing portion, and comprised of a bottom ledge surface of a semi-circular configuration defined by the circle of the second radial length and a top ledge surface of a semi-circular configuration defined by the circle of the first radial length, said at least one track member further defining a receiving side and a fastening side and operative to receive the hooked end portion of the at least one key at said receiving side of the at least one track member when the front housing portion and the rear housing portion are tandemly-positioned and the at least one key is aligned with the receiving side of the at least one track member such that, once the hooked end portion is positioned at the receiving side, sliding translation of the front housing portion upon the top edge surface of the perimetal flange of the rear housing portion causes translation of the bottom face surface of the hooked end portion of the key along the bottom ledge surface of the track member to position the hooked end portion at the fastening side to fasten the front housing portion and the rear housing portion theretogether when positioned thereat.

2. The combination of claim 1 wherein said at least one key is integrally formed with the front housing portion.

3. The combination of claim 1 wherein said at least one key comprises a downwardly-projecting bar member.

4. The combination of claim 1 wherein said at least one key is comprised of a rigid material.

5. The combination of claim 1 wherein said at least one track member further defines an end wall surface connecting the bottom ledge surface and the top ledge surface theretogether.

6. The combination of claim 5 wherein the top ledge surface of the at least one track member further comprises a beveled front edge surface portion.

7. The combination of claim 5 wherein the top edge surface of the perimetal flange extending about at least the portion of the perimeter of the rear housing portion is of a semi-circular configuration defined by a circle which is concentric with the circle which defines the semicircular configuration of the second radial length of the bottom ledge surface.

8. The combination of claim 5 wherein the at least one key is of a length such that, when the front housing portion is tandemly-positioned, and aligned with, the rear housing portion to position the bottom face surface of the hooked end portion of the at least one key in abutting engagement with the bottom ledge surface at the receiving side of the at least one track member, a bottom surface of the top housing portion rests upon the top edge surface of the perimetal flange in abutting engagement thereat.

9. The combination of claim 5 wherein the bottom ledge surface extends between the receiving side and the fastening side of the at least one track member.

10. The combination of claim 9 wherein the top ledge surface extends along only the fastening side of the at least one track member.

11. In a radio transceiver having electronic circuitry disposed upon at least one circuit board and housed within a housing assembly comprised of a front housing portion and a rear housing portion, the rear housing portion having a perimetal flange extending about at least a portion of a perimeter thereof, the perimetal flange having a top edge surface for receiving the front housing portion thereupon, a combination with the housing assembly of a fastener for fastening the front and rear housing portions, respectively, theretogether, said fastener comprising:

at least one key having a hooked end portion coupled to, and extending beneath, the front housing portion, the hooked end portion of the at least one key having a top face surface, a bottom face surface, and side face surfaces wherein the hooked end portion is semi-circular in configuration with the top face surface of the hooked end portion defined by a circle of a first radial length and the bottom surface of the front housing portion is of a semi-circular configuration defined by a circle of a second radial length which is concentric with the circle of the first radial length; and at least one track member, formed upon an inner sidewall of the perimetal flange of the rear housing portion and comprised of a bottom ledge surface of a semi-circular configuration defined by the circle of the second radial length and a top ledge surface of a semi-circular configuration defined by the circle of the first radial length, said at least one track member further defining a receiving side and a fastening side and operative to receive the hooked end portion of the at least one key at said receiving side of the at least one track member when the front housing portion and the rear housing portion are tandemly-positioned and the at least one key is aligned with the receiving side of the at least one track member such that, once the hooked end portion is positioned at the receiving side, sliding translation of the front housing portion upon the top edge surface of the perimetal flange of the rear housing portion causes translation of the bottom surface of the hooked end portion of the key along the bottom ledge surface of the track member to position the hooked end portion at the fastening side to fasten the front housing portion and the rear housing portion theretogether when positioned thereat.

12. In the radio transceiver of claim 11, a further combination with the housing assembly of: means for preventing continued sliding translation of the front housing portion once the hooked end portion of the at least one key is positioned at the fastening side.

13. A housing assembly for housing an electronic circuit disposed upon a circuit board, said housing assembly comprising:

a front housing portion defining a front-housing face surface and a front-housing bottom surface of a semi-circular configuration of a third radial length;

a rear housing portion defining a rear-housing face surface, the rear housing portion having a perimetal flange extending about at least a portion of a perimeter of the rear-housing face surface, the perimetal flange having a top edge surface of a semi-circular configuration of the third radial length for receiving the front-housing bottom surface thereupon;

at least one key having a hooked end portion coupled to the front housing portion and extending beneath the front-housing bottom surface, the front housing portion, the hooked end portion of the at least one key having a top face surface, a bottom face surface, and side face surfaces wherein the hooked end portion is semi-circular in configuration with the top face surface of the hooked end portion defined by a circle of a first radial length and the bottom face surface of the hooked end portion is of a semi-circular configuration defined by a circle of a second radial length which is concentric with the circle of the first radial length; and at least one track member formed upon an inner sidewall of the perimetal flange of the rear housing portion and comprised of a bottom ledge surface of a semi-circular configuration defined by the circle of the second radial length and a top ledge surface of a semi-circular configuration defined by the circle of the first radial length, said at least one track member further defining a receiving side and a fastening side and operative to receive the hooked end portion of the at least one key at said receiving side of the at least one track member when the front housing portion and the rear housing portion are tandemly-positioned and the at least one key is aligned with the receiving side of the at least one track member such that, once the hooked end portion is positioned at the receiving side, sliding translation of the front housing portion upon the top edge surface of the perimetal flange of the rear housing portion causes translation of the bottom face surface of the hooked end portion of the key along the bottom ledge surface of the track member to position the hooked end portion at the fastening side to fasten the front housing portion and the rear housing portion theretogether when positioned thereat.

14. The housing assembly of claim 13 further comprising means for preventing continued sliding translation of the front housing portion once the hooked end portion of the at least one key is positioned at the fastening side.

* * * * *